(12) United States Patent
Brown et al.

(10) Patent No.: US 7,843,273 B2
(45) Date of Patent: Nov. 30, 2010

(54) MILLIMETER WAVE MONOLITHIC INTEGRATED CIRCUITS AND METHODS OF FORMING SUCH INTEGRATED CIRCUITS

(75) Inventors: Kenneth W. Brown, Yucaipa, CA (US); Andrew K. Brown, Victorville, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/266,229

(22) Filed: Nov. 6, 2008

(65) Prior Publication Data

US 2010/0109784 A1    May 6, 2010

(51) Int. Cl.
*H03F 3/14*    (2006.01)
(52) U.S. Cl. .................................... 330/307; 330/310
(58) Field of Classification Search ............... 330/307, 330/310, 150, 98
See application file for complete search history.

(56) References Cited

U.S. PATENT DOCUMENTS

| | | |
|---|---|---|
| 4,631,492 A | 12/1986 | Magarshack et al. |
| 5,966,520 A | 10/1999 | Buer et al. |
| 6,388,528 B1 | 5/2002 | Buer et al. |
| 6,583,673 B2 * | 6/2003 | Ahl et al. ................. 330/310 |
| 6,867,651 B2 | 3/2005 | Buer et al. |
| 7,233,199 B2 * | 6/2007 | Westwick et al. ........... 330/85 |
| 2005/0175069 A1 | 8/2005 | Zelley et al. |
| 2008/0231374 A1 | 9/2008 | Buer et al. |

FOREIGN PATENT DOCUMENTS

WO    WO-2010053554 A1    5/2010

OTHER PUBLICATIONS

"International Application Serial No. PCT/US2009/05986, Search Report mailed Jan. 11, 2010", 2 pgs.
"International Application Serial No. PCT/US2009/05986, Written Opinion mailed Jan. 11, 2010", 7 pgs.

* cited by examiner

*Primary Examiner*—Henry K Choe
(74) *Attorney, Agent, or Firm*—Schwegman, Lundberg & Woessner, P.A.; Gregory J. Gorrie

(57) ABSTRACT

A description is provided of a high-frequency, multi-stage, millimeter wave amplifier integrated circuit, and of a method for designing and constructing the circuit. The methods and structures have been created to enable the construction of an amplifier offering substantial gain at a relatively high power and high frequency, but occupying minimal area of an integrated circuit die. Various structures and methodologies are described which each contribute to the practical feasibility of constructing an amplifier with such performance in a relatively compact space.

15 Claims, 5 Drawing Sheets

MILLIMETER WAVE MONOLITHIC INTEGRATED CIRCUITS AND METHODS OF FORMING SUCH INTEGRATED CIRCUITS

BACKGROUND OF THE INVENTION

The present invention relates generally to high frequency millimeter wave integrated circuit amplifiers, and more particularly relates to such high frequency amplifiers configured for use at frequencies of 75 GHz and higher.

The design and manufacture of high frequency, millimeter wave integrated circuit devices presents many challenges not found in the construction of other types of integrated circuits. However, the design and manufacture of circuits for operation in the W-band and above, frequencies of approximately 75 GHz and above, present particular challenges, as circuits and structures suitable for use even at lower millimeter wave frequencies, for example as may be suitable for devices operating at 30 GHz, do not function similarly or adequately at 75 GHz and above.

As will be apparent to those skilled in the art, structures such as filters suitable for use at the identified higher frequencies must be adapted for such frequencies. Additionally, however, the placement and configuration of signal and voltage lines can present substantial problems of resonance or "ringing" of the circuits. These problems are heightened when the integrated circuit is an amplifier, particularly one offering relatively high gain and power; and particularly when there is a need to form the amplifier in a minimal area on a substrate, for example a minimally-sized semiconductor die. Forming such an amplifier on a minimally-sized die is highly advantageous from a cost perspective, as smaller die will yield more die per semiconductor wafer, thus providing more devices for essentially no increase in the cost of wafer processing. Additionally and importantly, from an application perspective, the smaller a die may be made, the less space it takes in a final system; and such smaller size is often a significant factor in the system design.

Conventionally, relatively high power, multi-stage, millimeter wave amplifier circuits rely upon design rules resulting in relatively large spaces between signal lines and other components in order to avoid the above-described resonance or ringing. While these design rules are generally effective for such purposes, the resulting large spaces increase the total area occupied on a die by such an amplifier. Additionally, with such conventional design methodologies, a power buss for gate bias voltage is typically routed along the periphery of the die to minimize distortion of the voltage signals from the high-frequency signals being amplified. Such a structure, and the routing of voltage lines from the peripheral busses to individual amplifier stages, with the lines surrounded by substantial open area to reduce the risk of interference that result from such a structure, again require additional space on a die, and thereby again increase the relative size of the die. Additionally, for drain bias, discrete bias pads are typically provided for each amplifier stage, again occupying substantial area on the die. Accordingly, for such high frequency millimeter wave amplifiers, the conventional design criteria and methodology tend to increase the size of the device where compactness would be an asset.

Accordingly, the present invention provides a new configuration for and method of construction of a multi-stage, millimeter wave amplifier integrated circuit, where the circuit is intended for operation at 75 GHz and above, and where the amplifier may be constructed with relatively high gain and power output, as will be described later herein, and where the amplifier may also be constructed more compactly than has been feasible for conventional devices of such type.

SUMMARY OF THE INVENTION

The present disclosure describes an amplifier providing examples of various inventive methods and structures that enable the construction of a multi-stage, millimeter wave amplifier, as further defined below. The present example will be based on the description of an amplifier intended for operation: at 95 GHz, and having an optimally minimal die size. The minimal die size is achieved by use of various individually-inventive structures as further described. In this example, these inventive structures include: some amplifier stages placed in generally side-by-side orientation to one another; some amplifier stage signal paths extending in generally opposite directions to one another; reduced numbers of bias bond pads; bias lines extending between some amplifier stages; and additional structures as will be described below.

Although for purposes of the current example these various inventive structures are described in relation to a single example amplifier, at least some benefits of the present inventive concepts may be obtained without combining all features as described herein. Thus, the combination of the various features described herein, while certainly beneficial, is not in any way required, and the inventive subject matter should be clearly understood to be that subject matter defined by the claims supported by the present disclosure and the equivalents of such claims.

DETAILED DESCRIPTION OF PREFERRED EMBODIMENTS

Figure 1:
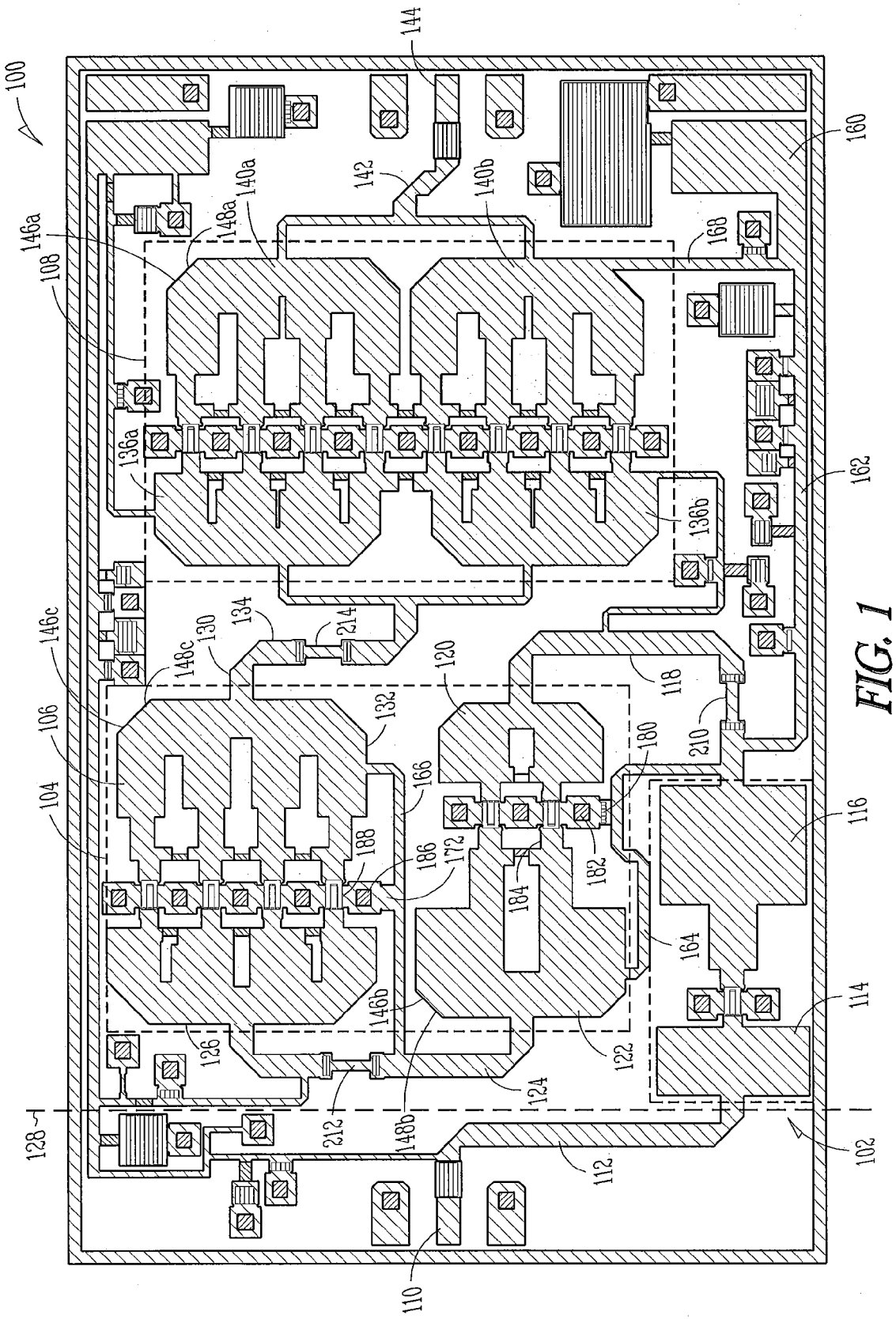
FIG. 1 depicts a physical layout representation of an amplifier providing one example of the present invention.

Referring now to the drawings in more detail, and particularly to FIG. 1, the figure depicts an example layout for a multi-staged, millimeter wave amplifier integrated circuit 100, illustrating various aspects of the present inventive subject matter. As noted earlier herein, the present invention is specifically directed to a multi-stage, millimeter wave amplifier's operating act 75 GHz and above. Additionally, for the present inventors, configuration of amplifiers operating at 90 GHz and above has been a particular concern; and example amplifier 100 is intended for operation at 95 GHz. For purposes of the present disclosure, relatively high gain amplifiers, as can particularly benefit from the principles described herein, are considered those operating at a frequency at or above 75 GHz, and providing at least 15 db of gain, and a power of a least 1 Watt. In accordance with the principles described herein, and amplifier meeting at least two or more of these performance objectives, and having at least four stages of amplification, can be achieved in an integrated circuit surface area of no more than 5 square mm, and in some implementations as described herein for amplifier 100, can be achieved in no more that approximately 4 sq mm (allowing for minor variations in sizing of less than 5%, such as those resulting from the die singulation process or processing constraints).

Figure 2:
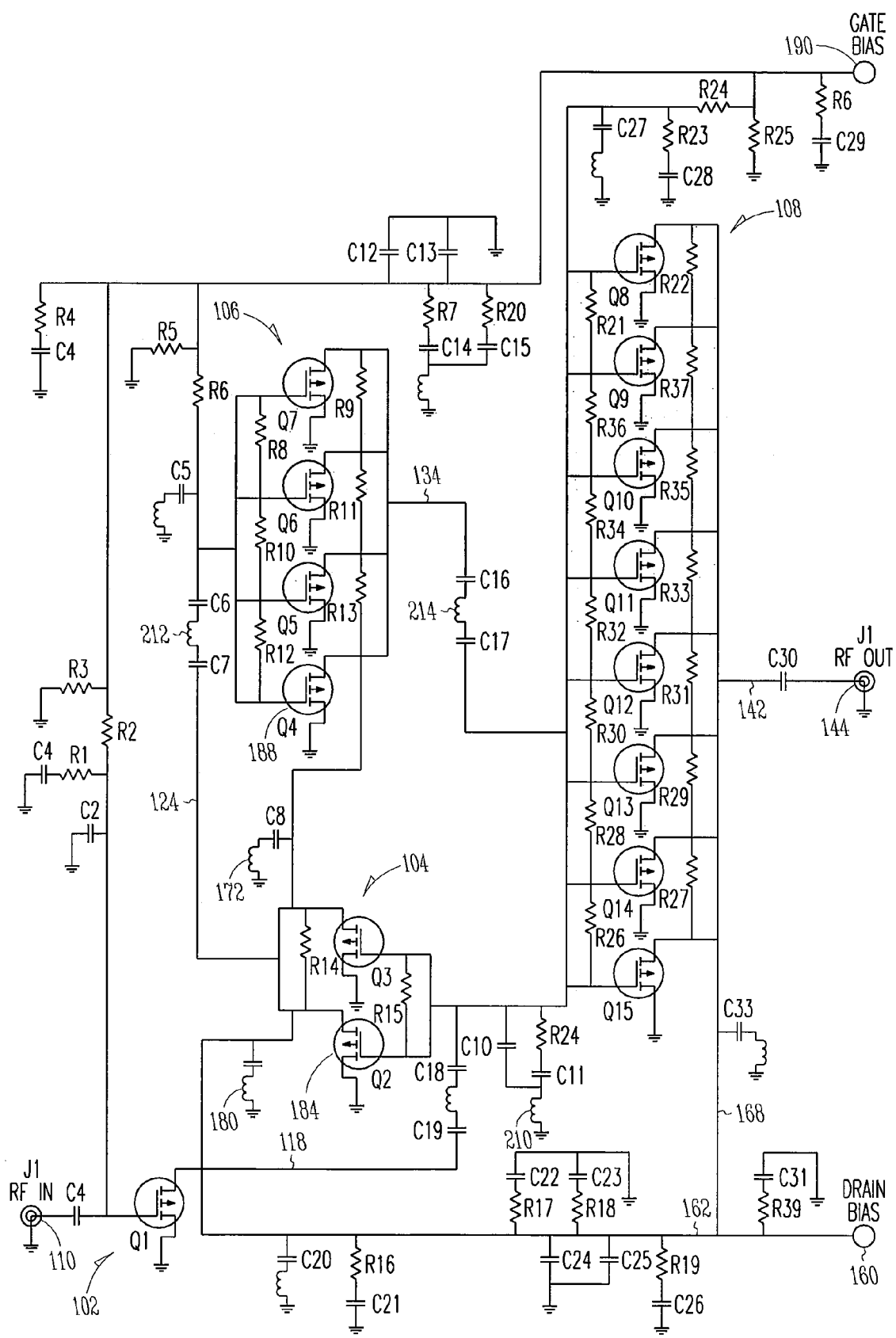
FIG. 2 schematically depicts the circuit of the amplifier of FIG. 1.

Referring now also to FIG. 2, that figure schematically depicts amplifier 100 of FIG. 1; Reference is now made primarily to FIG. 1, however reference to FIG. 2 may be helpful for understanding the specific circuitry in amplifier 100. Amplifier 100 includes four stages, as indicated generally at 102, 104, 106 and 108. A signal input pad is provided at 110, and a signal line 112 carries the input signal to the input of first amplifier stage 102 at gate pad 114. The output of first stage 102, at drain pad 116, is coupled through line 118 to the input of second amplifier stage 104 at gate pad 120. The output of second stage 104, at drain pad 122, is coupled through signal line 124 to the input of third stage 106, at gate pad 126. As is apparent from FIG. 1, the first, second and third stages, 102, 104 and 106, respectively, are arranged in alternate directions, with the gate pads of first stage 102 and third stage 106 to the left-hand side of each respective stage, as depicted; but with gate pad 120 of second stage 104 reversed in orientation, on the right-hand side of such stage, as depicted. The result of this configuration is that the signal path proceeds through these first three stages 102, 104, and 106 in alternating directions. Additionally, in the depicted example, second stage 104 is substantially vertically aligned with third stage 106 (again, as depicted), and is substantially aligned with first stage 102. For purposes of determining "substantial alignment" as used in the present disclosure, reference will be made to the dimension of a stage ("width," as depicted) extending from the outermost extent of the gate pad to the outermost extent of the drain pad. Substantial alignment between stages is considered to exist where at least one-half the width of a stage is within the width of another stage. The placement of multiple stages predominantly within a columnar space 128 extending between opposing sides of amplifier 100 is accomplished in a limited space through use of the above-described alternating orientation of second stage 104 relative to first stage 102 and third stage 106. The output of third stage 106 at drain pad 132 extends through signal line 134 to gate pads 136a, 136b forming the input of fourth stage 108. The output of fourth stage 108, at drain pads 140a, 140b couples through line 142 to output pad 144.

As will be known to those skilled in the art, the dimensions of gate pads 114, 120, 126, 136a, 136b and drain pads 116, 122, 132, 140a, 140b are sized to provide appropriate impedance matching for the transition between the transistors of one stage to the transistors of the following stage. As will be known to those skilled in the art, each transistor in the amplifiers stages is a HEMT, or a high electron mobility transistor, well-known in the art high-frequency devices. In addition to the sizing of such gate and drain pads, as apparent from FIG. 1, in amplifier 100 each gate pad 120, 126, 136a, 136b and each drain pad 122, 132, 140a, 140b of the second, third and fourth stages has been implemented with chamfered corners (see, as marked at 146a, 146b, 146c) at the outer extent of such pads. These corners are chamfered, relative to formation of a right angle, in these stages to provide a smoother transition for signals through the pad. In this example, the dimension of each angled surface forming the chamfer is approximately 70 to 140 microns long, representing a reduction of the length of each side forming a corner of about 50 to 100 microns, relative to the length that would be present with a right angle between those sides. As will be apparent to those having the benefit of this disclosure, there are alternatives to use of chamfered corners on the gate and drain pans, such as, for example, the forming of curvilinear, radiused corners. At frequencies above 75 GHz, and even more so at frequencies at 90 GHz and above, such as 95 GHz as amplifier 100 is designed for, smoothing the signal transitions will improve the signal path and ease the design considerations for the device.

Figure 3:
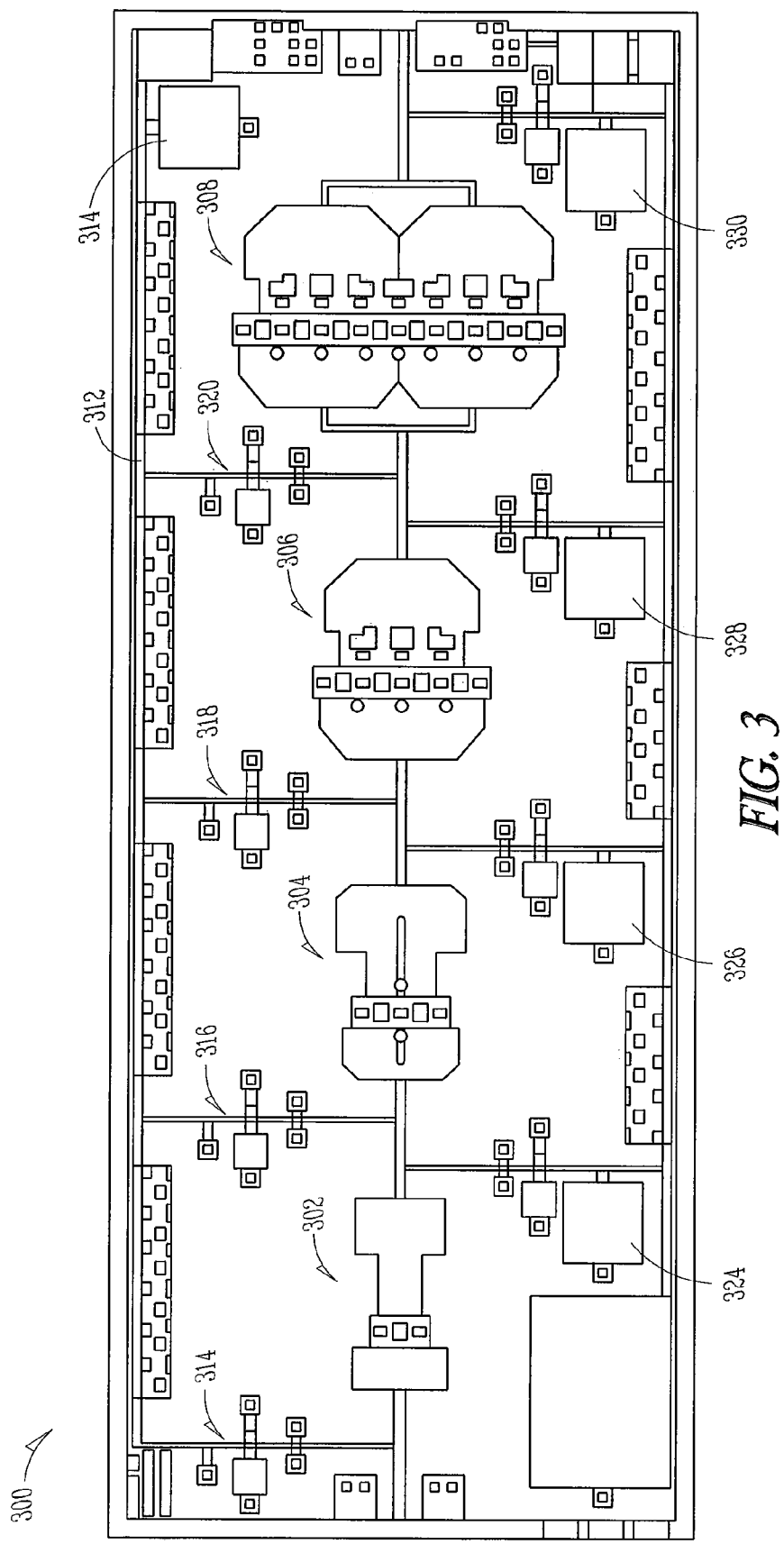
FIG. 3 depicts a physical layout representation of an amplifier having comparable performance to the amplifier of FIG. 1, but designed in accordance with design methodologies known in the prior art.

In order to better highlight the substantial differences of the configuration of amplifier 100 over prior art designs, reference is now made to FIG. 3, which depicts the layout of an amplifier 300, designed in accordance with conventional methodologies, to provide essentially the same gain and power as amplifier 100, at the same frequency, and again through four amplifier stages. Yet amplifier 300 occupies approximately twice the area of amplifier 100. In the design of amplifier 300, the die size is approximately 5 mm by 1.9 mm., for an area of 9.5 sq. mm. In contrast, as noted above amplifiers may be constructed in accordance with the teachings herein occupying no more that 5 sq. mm., and amplifier 100 has an area of approximately 4 sq. mm. Applicants do not represent that all conventional designs known prior to the present invention are configured in accordance with the exact design principles of amplifier 300. However, amplifier 300 is one example of an amplifier configuration constructed in accordance with the previously-described prior art methodologies and which is directly comparable in performance to the example amplifier 100 used to identify different aspects of the present inventive subject matter.

Amplifier 300 is again a four stage amplifier as indicated at 302, 304, 306, and 308. In accordance with one conventional practice, amplifier 300 includes a gate bias pad 310 coupled to a gate bias bus 312 extending along a side of the die of amplifier 300, and generally the entire length of the die. As can be seen in the figure, a respective gate bias spur line 314, 316, 318, 320 extends directly to each amplifier stage 302, 304, 306, 308 from gate bias bus 312 with a generally straight lead. On the opposite side of the die, amplifier 300 includes separate drain pads for each amplifier stage, as shown at 324, 326, 328, and 330, each coupled by lines again surrounded by substantial open area to a respective drain of each amplifier stage 302, 304, 306, 308.

Figure 4:
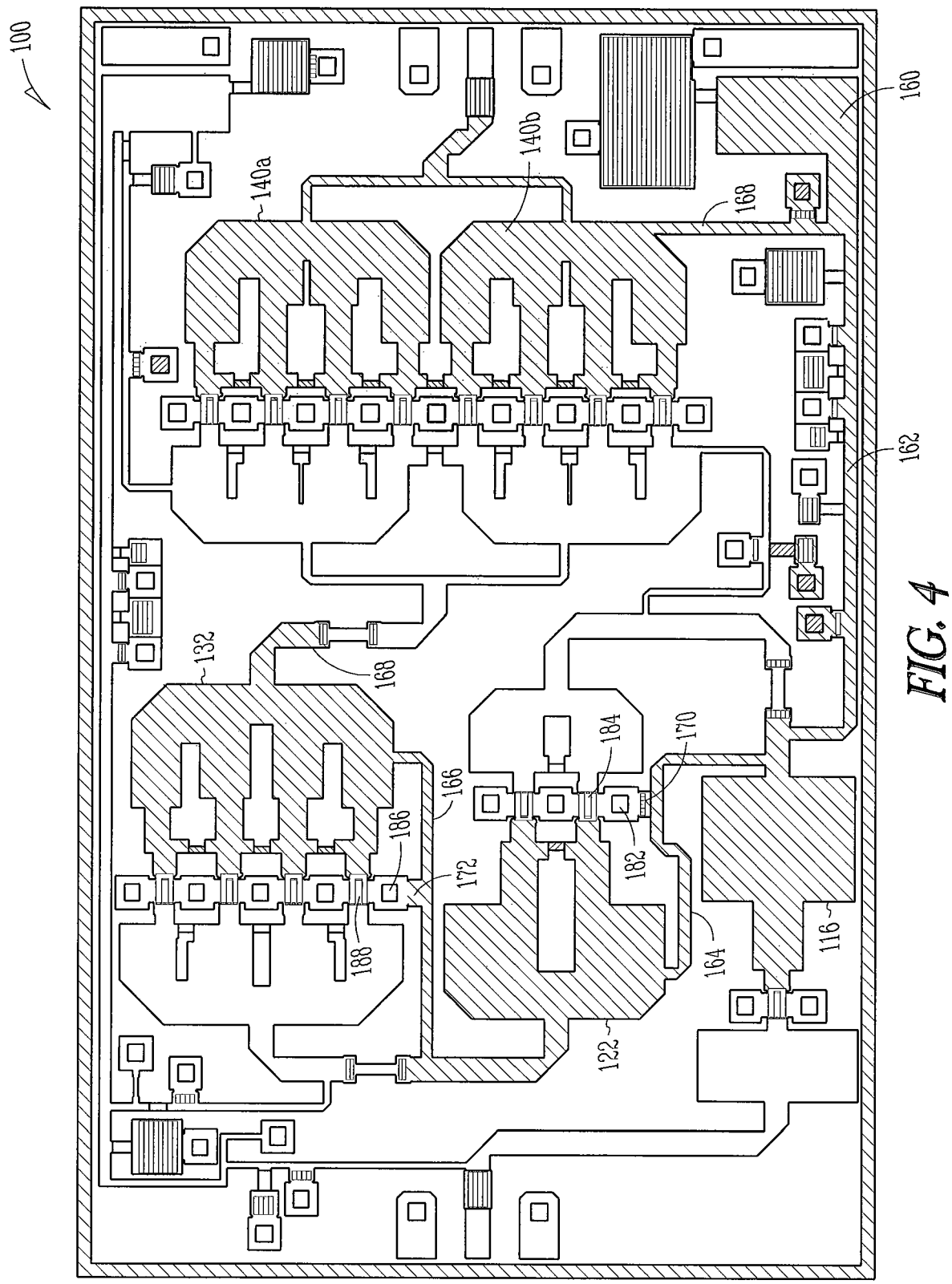
FIG. 4 depicts the representation of the amplifier of FIG. 1 depicted to identify the drain bias paths of the amplifier.

Referring now to FIG. 4, therein is depicted amplifier 100, as shown in FIG. 1, but with the drain bias paths identified through crosshatching. A single drain bias pad 160 is connected through identified leads 162, 164, 166, 168 to each amplifier stage drain pad 116, 122, 132, 140a, 140b. As can be seen in FIG. 4, in example amplifier 100 these connections are achieved through use of drain bias lines 164, 166, which extend between the structures of the first, second and third amplifier stages 102, 104, and 106. For example, drain bias line 164 extends between the first and second amplifier stages from a relatively right-most portion of first amplifier stage 102 to a relatively left-most portion of second amplifier stage 104. Similarly, drain bias line 166 extends between the second and third amplifier stages, from a relatively left-most portion of second amplifier stage 104 to a relatively right-most portion of third amplifier stage 106.

In accordance with conventional design practices, the direct interconnection of amplifier stage drain pads with one another would lead to an expectation of increased crosstalk and/or coupling between stages, with the anticipated result of oscillations or other instabilities within amplifier 100. One way in which these anticipated instabilities are addressed in the example of amplifier 100 is through the use of bias line filters proximate the stages. In this example amplifier 100, these bias filters are RF blocking, DC-pass bias filters 170, 172, 174, 176 implemented as tuned resonance circuits, and having the structure of a capacitor in series with an inductor, as can also be seen in FIG. 2. Additionally, one bias line filter 160 has been implemented as a capacitor in parallel with a series-connected resistor and capacitor, and an inductor. In amplifier 100, the inductors are implemented in the vias to a ground plane on the back surface of each die (not illustrated), and thus the filters are tuned to the naturally occurring inductance in the vias, according to the particular process used for the amplifier manufacture. These bias filters are specifically tuned to represent a short to ground at 95 GHz, thereby removing signal frequencies from the bias lines.

One feature utilized in amplifier 100 to facilitate a close spacing of the components is minimizing of the space required to integrate such components. For example, bias line filter 170 off drain bias line 164 extends to ground on the rear surface of the die (not illustrated), upon which amplifier 100 is formed. As implemented, drain bias line filter 170 shares a ground via 182 with the grounded source of a first transistor 184 in second stage 104. Similarly, a second bias line filter 172 shares a ground via 186 with a first transistor 188 of third stage 106.

Figure 5:
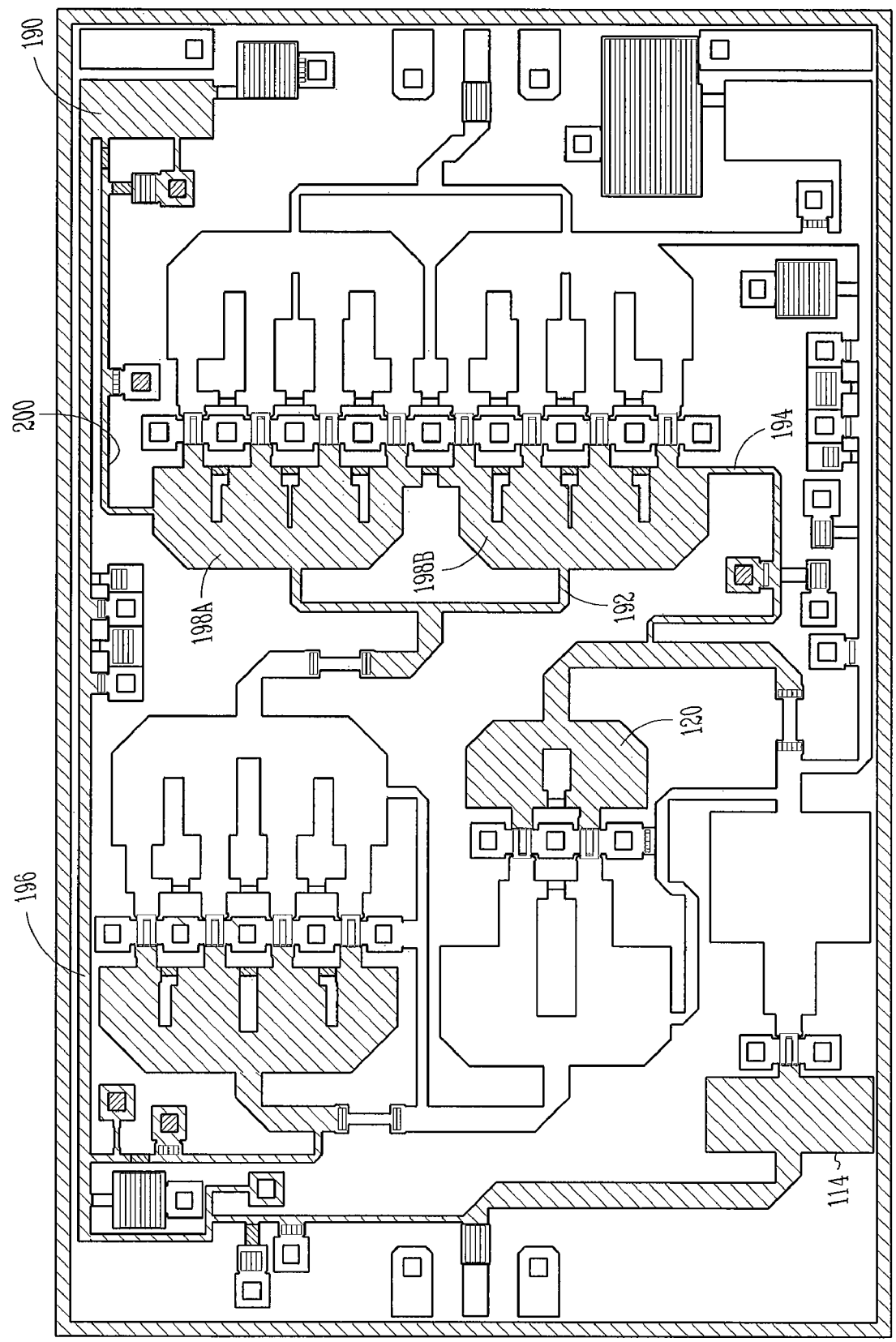
FIG. 5 depicts the representation of the amplifier of FIG. 1 depicted to identify the gate bias paths of the amplifier.

Referring now to FIG. 5, therein is shown amplifier 100 of FIG. 1 but with the gate bias paths identified through cross-hatching. Again, there is a single gate bias pad 190 which extends through multiple leads to each gate pad 114, 120, 196, 198a, 198b of each of the four amplifier stages. It can be seen that where drain bias lines extended between stages by traversing a generally horizontal path through amplifier 100 (as depicted), the gate bias lines extend between the fourth amplifier stage and the second and third stages in a generally perpendicular orientation, or by reference to the depiction, through a generally vertical path through amplifier 100. For example, a first gate bias line 190 extends to gate bias pad 198a of fourth amplifier stage 108, which is then coupled through line 192 to gate bias pad 198b of the stage, and then through lead 194 to gate bias pad 120 of second amplifier stage 104. Similarly, gate bias line 196 extends relatively vertically to the left side (as depicted) of the first three amplifier stages, 102, 104, 106.

Referring again to FIGS. 1 and 2, another mechanism relied upon in amplifier 100 to minimize instabilities resulting from the close spacing required to achieve the relatively reduced size is the use of a band pass, DC-block filter to provide out-of-band isolation between stages. In the example of amplifier 100, these band pass filters are each implemented as three stage, lumped element filters including a capacitor, inductor and capacitor, connected in series, as depicted at 210, 212, 214. In this example, the inductor is preferably implemented by a section of reduced line width place between the two capacitors, with the length and width of such reduced section tuned to provide the desired inductance and thus filter characteristics.

As will be apparent to those skilled in the art, the specific configuration of components, and the selection of appropriate values for components will be virtually completely dependent upon the specific parameters, design and implementation of such an amplifier. In amplifier 100, the placement of fourth stage 108 relative to the prior stages 102, 104, 106 provides a relatively shorter length for signal line; 134, which is particularly advantageous for the relatively high gain, high power signal on that line, relative to the signal lines on the earlier stages.

Amplifier 100 used to illustrate the inventive techniques and structures was developed through electromagnetic modeling of the desired structure. Such modeling may be performed through use of software such as that marketed under the name of Agilent ADS, by Agilent Technologies, Inc., of Santa Clara, Calif. Additionally, it has been found useful to model and simulate the device in the context of a larger circuit in which it is to be used. That simulation and modeling may be performed through use of Ansoft HFSS software, offered by Ansoft LLC, a subsidiary of ANSYS, Inc. Because virtually every component and its physical structure on the die has the potential to impact the overall stability of the constructed device, such electromagnetic modeling allows fine-tuning of the components and the layout to achieve a balanced and operative device. For example, the dimensions of each the previously-identified chamfered corners 146a, b, c (representative) on each of gate pads 120, 126, 136a, 136b and drain pads 122, 132, 140a, 140b, as well as the size and configuration of each lead, as well as of the identified filter components may be iteratively determined and adjusted through such modeling.

Many modifications and variations may be made on the structures and techniques described it and illustrated herein, without departing from the spirit and scope of the present invention. For example, amplifiers having more than four stages may be constructed. Additionally, different configurations for bias filters in the bias lines, and for filters to establish isolation between amplifier stages may be used. And as noted previously, not all of the identified structures and techniques have to be combined into a single design.

We claim:

1. A high-frequency, millimeter wave amplifier constructed on a substrate and configured for use at a frequency of 75 GHz or higher, comprising:
   at least first, second, third and fourth amplifier stages coupled in series, such amplifier stages configured to provide an output signal in the frequency range, with a signal gain of at least 15 db, and with a power of at least 1 Watt;
   a single drain bias bond pad provided on the substrate to provide a drain bias voltage to drains of the first, second, third and fourth amplifier stages;
   a first drain bias line electrically coupled to the single drain pad and coupling the drain of the first amplifier stage to the drain of the second amplifier stage, the first drain bias line extending at least partially alongside and between the first and second amplifier stages; and
   a second drain bias line coupling the drain of the second amplifier stage to a drain of the third amplifier stage, the second drain bias line extending at least partially alongside and between the second and third amplifier stages,
   wherein a first signal path from a gate side to a drain side of the first amplifier stage extends in a first direction, a second signal path from a gate side to a drain side of the second amplifier stage extends in a second direction, and a third signal path from a gate side to a drain side of the third amplifier stage extends in the first direction, the second direction being generally opposite to the first direction,
   wherein positioning of the drain bias lines and the generally opposite directions of signal paths through the second amplifier stage allow the amplifier is configured to occupy an area on the substrate of no greater than 5 square millimeters.

2. The amplifier of claim 1, wherein the amplifier is configured to occupy an area on the substrate of no greater than approximately 4 square millimeters.

3. The amplifier of claim 1, wherein the amplifier provides a signal gain of at least 20 db.

4. The amplifier of claim 1, wherein the amplifier provides an output signal at a power of at least 1.5 Watt.

5. A method of forming a high-frequency, millimeter wave amplifier for use at a frequency of 75 GHz or higher, and having at least four serially-connected stages, comprising the acts of:
   forming at least first, second and third of the four serially connected amplifier stages on a substrate, and
   forming a single drain bias bond pad provided on the substrate to provide a drain bias voltage to drains of the first, second and third amplifier stages;
   forming a first drain bias line electrically coupled to the single drain bias bond pad and coupling the drain of the first amplifier stage to the drain of the second amplifier stage, the first drain bias line extending at least partially alongside and between the first and second amplifier stages; and
   forming a second drain bias line coupling the drain of the second amplifier stage to the drain of the third amplifier stage, the second drain bias line extending at least partially alongside and between the second and third amplifier stages,
   wherein a first signal path from a gate side to a drain side of the first amplifier stage extends in a first direction, a second signal path from a gate side to a drain side of the second amplifier stage extends in a second direction, and a third signal path from a gate side to a drain side of the third amplifier stage extends in the first direction, wherein the second direction is generally opposite to the first direction.

6. The method of claim 5, wherein the first, second and third amplifier stages are disposed in generally side-by-side relation to one another and substantially located within a column extending between two opposing sides of the substrate.

7. The method of claim 5, wherein the first amplifier stage includes two gates, and wherein the second amplifier stage comprises four gates.

8. A high-frequency, millimeter wave amplifier constructed on a substrate and configured for use at a frequency of at least 90 GHz, comprising:
   at least four amplifier stages;
   a single drain bias bond pad provided on the substrate to provide a drain bias voltage to drains of the amplifier stages;
   a first drain bias line electrically coupled to the single drain pad and coupling the drain of the first amplifier stage to the drain of the second amplifier stage, the first drain bias line extending at least partially alongside and between the first and second amplifier stages; and
   a second drain bias line electrically coupled to the single drain bias bond pad and coupling the drain of the second amplifier stage to a drain of the third amplifier stage, the second drain bias line extending at least partially alongside and between the second and third amplifier stages,
   wherein a first signal path from a gate side to a drain side of the first amplifier stage extends in a first direction, a second signal path from a gate side to a drain side of the second amplifier stage extends in a second direction, and a third signal path from a gate side to a drain side of the third amplifier stage extends in the first direction, the second direction being generally opposite to the first direction.

9. The amplifier of claim 8, further comprising a first notch filter operatively coupled to the first bias line.

10. The amplifier of claim 9, further comprising a second notch filter operatively coupled to the second bias line.

11. A high-frequency, millimeter wave amplifier constructed on a substrate and configured for use at a frequency of at least 90 GHz, comprising at least four amplifier stages,
   wherein one of the amplifier stages defines a signal path from gate to drain in a first direction,
   wherein a subsequent of the amplifier stages defines a signal path from gate to drain in a second, generally opposite, direction,
   wherein a first bias line electrically couples the drain of the one amplifier stage to the drain of the subsequent amplifier stage, and wherein the first bias line extends at least partially alongside and between such amplifier stages,
   wherein a later amplifier stage follows the subsequent amplifier stage,
   wherein a second bias line electrically couples the drain of the subsequent amplifier stage to the drain of the later amplifier stage,
   wherein the second bias line extends at least partially alongside and between such amplifier stages,
   wherein the amplifier comprises at least one transistor source coupled to ground, and a notch filter,
   wherein at least one of the notch filters comprises a component coupled to ground, and
   wherein both such connections to ground are shared through a single via through the substrate.

12. A method of making a millimeter wave amplifier for use at a frequency of at least 90 GHz, comprising the acts of:
   establishing an initial configuration for said amplifier, said configuration comprising at least four amplifier stages, each stage comprising a gate pad, at least one transistor, and a drain pad, and wherein,
   at least two of said amplifier stages are substantially aligned with one another in side-by-side orientation;
   with respect to at least three of said amplifier stages, a first drain bias line extends between a first pair of said stages, and a second drain bias line extends between a second pair of said stages; and
   each signal line connecting the output of a stage to the input of a following stage comprises a band bass filter providing a DC-block between such stages;
   determining an electromagnetic model of the established initial configuration; and
   modifying the initial configuration in response to said determined electromagnetic model.

13. The method of claim 12, wherein the act of modifying the initial configuration in response to the determined electromagnetic model comprises at least one of adding or tuning at least one filter on at least one of said gate bias line and said drain bias line.

14. A millimeter wave amplifier configured for use at a frequency of at least 90 GHz, comprising:
   at least four amplifier stages, each stage comprising a gate pad, at least one transistor, and a drain pad,
   at least one drain bias bond pad, but fewer drain bias bond pads than the number of amplifier stages;
   at least one gate bias bond pad, but fewer gate bias bond pads than the number of amplifier stages;
   and wherein,
   at least two of said amplifier stages are substantially aligned with one another in side-by-side orientation;
   with respect to at least three of said amplifier stages, a first drain bias line extends between a first pair of said stages, and a second drain bias line extends between a second pair of said stages; and
   each signal line connecting the output of a stage to the input of a following stage comprises a band bass filter providing DC-blocking between such stages, wherein a first signal path from a gate side to a drain side of a first of the amplifier stages extends in a first direction, a second signal path from a gate side to a drain side of a second of the amplifier stages extends in a second direction, and a third signal path from a gate side to a drain side of a third of the amplifier stages extends in the first direction, the second direction being generally opposite to the first direction.

15. A millimeter wave amplifier configured for use at a frequency of at least 90 GHz, comprising:

at least four amplifier stages, each stage comprising a gate pad, at least one transistor, and a drain pad, no more than one drain bias bond pad;

no more than one gate bias bond pad;

wherein at least two of said amplifier stages are substantially aligned with one another in side-by-side orientation;

wherein with respect to at least three of said amplifier stages, a first bias line extends between a first pair of said stages, and a second bias line extends between a second pair of said stages;

wherein between the amplifier stages, a respective signal line couples the output of a stage to the input of a following stage, and wherein each such signal line comprises a band bass filter providing DC-blocking between the respective stages;

wherein at least one gate pad of an amplifier stage, and at least one drain pad of the same or another amplifier stage comprises an outer periphery defined by a non-right-angle meeting of surfaces;

a first bias filter operably coupled to said first bias line; and a second bias filter operably coupled to said second bias line.

* * * * *

UNITED STATES PATENT AND TRADEMARK OFFICE
CERTIFICATE OF CORRECTION

| | | |
|---|---|---|
| PATENT NO. | : 7,843,273 B2 | Page 1 of 1 |
| APPLICATION NO. | : 12/266229 | |
| DATED | : November 30, 2010 | |
| INVENTOR(S) | : Kenneth W. Brown et al. | |

It is certified that error appears in the above-identified patent and that said Letters Patent is hereby corrected as shown below:

In column 2, lines 10-11, delete "operation:" and insert -- operation --, therefor.

In column 3, line 7, delete "FIG. 1;" and insert -- FIG. 1. --, therefor.

In column 5, line 58, delete "line;" and insert -- line --, therefor.

In column 6, line 58, in Claim 1, after "amplifier" delete "is configured".

In column 7, line 6, in Claim 5, delete "substrate, and" and insert -- substrate; --, therefor.

Signed and Sealed this
Eighth Day of February, 2011

David J. Kappos
*Director of the United States Patent and Trademark Office*